(12) United States Patent
Bedell et al.

(10) Patent No.: US 9,818,761 B2
(45) Date of Patent: Nov. 14, 2017

(54) SELECTIVE OXIDATION FOR MAKING RELAXED SILICON GERMANIUM ON INSULATOR STRUCTURES

(71) Applicant: International Business Machines Corporation, Armonk, NY (US)

(72) Inventors: Stephen W. Bedell, Wappingers Falls, NY (US); Effendi Leobandung, Stormville, NY (US); Devendra K. Sadana, Pleasantville, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 14/750,485

(22) Filed: Jun. 25, 2015

(65) Prior Publication Data
US 2016/0380001 A1    Dec. 29, 2016

(51) Int. Cl.
| | | |
|---|---|---|
| *H01L 27/12* | (2006.01) | |
| *H01L 29/06* | (2006.01) | |
| *H01L 29/161* | (2006.01) | |
| *H01L 29/78* | (2006.01) | |
| *H01L 29/66* | (2006.01) | |

(52) U.S. Cl.
CPC ...... *H01L 27/1211* (2013.01); *H01L 29/0649* (2013.01); *H01L 29/161* (2013.01); *H01L 29/66795* (2013.01); *H01L 29/785* (2013.01)

(58) Field of Classification Search
CPC ................................................. H01L 21/02236
See application file for complete search history.

(56) References Cited

U.S. PATENT DOCUMENTS

| | | |
|---|---|---|
| 5,656,537 A | 8/1997 | Iwamatsu et al. |
| 7,550,309 B2 | 6/2009 | Yokokawa et al. |
| 7,550,370 B2 | 6/2009 | Chen et al. |

(Continued)

FOREIGN PATENT DOCUMENTS

| | | |
|---|---|---|
| CN | 103441062 A | 12/2013 |
| JP | 2011204801 A | 10/2011 |

(Continued)

*Primary Examiner* — Samuel Gebremariam
*Assistant Examiner* — Jonas T Beardsley
(74) *Attorney, Agent, or Firm* — Louis J. Percello; Ryan, Mason & Lewis, LLP

(57) ABSTRACT

Methods and devices are provided to fabricate semiconductor devices with, e.g., SiGe-on-insulator structures. For example, a method for fabricating a semiconductor device includes forming a crystalline buffer layer on a substrate, forming an epitaxial semiconductor layer on the crystalline buffer layer, patterning the epitaxial semiconductor layer to form a patterned epitaxial semiconductor layer, and oxidizing a surface region of the crystalline buffer layer selective to the patterned epitaxial semiconductor layer to convert the surface region of the crystalline buffer layer to an insulating layer. The insulating layer insulates the patterned epitaxial semiconductor layer from the crystalline buffer layer. In one example structure, the substrate is a silicon substrate, the crystalline buffer layer is formed of germanium, the epitaxial semiconductor layer is formed of silicon-germanium, and the insulating layer is formed of amorphous germanium-oxide.

12 Claims, 7 Drawing Sheets

(56) References Cited

U.S. PATENT DOCUMENTS

| | | | |
|---|---|---|---|
| 7,679,141 B2 | 3/2010 | Bedell et al. | |
| 7,816,664 B2 | 10/2010 | Bedell et al. | |
| 8,835,238 B2 | 9/2014 | Appenzeller et al. | |
| 2002/0197806 A1* | 12/2002 | Furukawa | H01L 21/2254 438/305 |
| 2008/0246019 A1* | 10/2008 | Bedell | H01L 21/7624 257/19 |
| 2014/0103366 A1 | 4/2014 | Chidambarrao et al. | |
| 2014/0197456 A1* | 7/2014 | Wang | H01L 29/785 257/192 |
| 2014/0199825 A1 | 7/2014 | Bian et al. | |
| 2014/0319462 A1* | 10/2014 | Huang | H01L 29/785 257/18 |
| 2015/0021691 A1 | 1/2015 | Akarvardar et al. | |
| 2015/0145002 A1* | 5/2015 | Lee | H01L 27/0922 257/192 |

FOREIGN PATENT DOCUMENTS

| | | | |
|---|---|---|---|
| JP | 2012231165 A | 11/2012 | |
| JP | 5601595 B2 | 10/2014 | |

* cited by examiner

US 9,818,761 B2

1

SELECTIVE OXIDATION FOR MAKING RELAXED SILICON GERMANIUM ON INSULATOR STRUCTURES

TECHNICAL FIELD

This disclosure relates generally to semiconductor fabrication techniques and, in particular, to structures and methods for fabricating semiconductor devices such as FinFETs.

BACKGROUND

FinFET technology is an emerging semiconductor technology that is being researched and developed to provide effective scaling solutions for field effect transistor (FET) fabrication at, and below, the 22 nm node. FinFET structures include one or more narrow semiconductor fin structures, wherein each semiconductor fin structure is gated on at least two sides thereof. FinFET structures may be formed using silicon-on-insulator (SOI) substrates, as SOI technology provides low source/drain diffusion, low substrate capacitance, and ease of electrical isolation by shallow trench isolation structures. FinFETs may be also formed on bulk substrates to reduce wafer cost and/or enable formation of certain devices in the bulk substrate. However, the use of SOI substrates or bulk substrates to construct FinFET devices having semiconductor fin structures comprising silicon-germanium (SiGe), for example, can be problematic with regard to fabrication complexity and costs.

SUMMARY

One embodiment of the invention includes a method for fabricating a semiconductor device. A crystalline buffer layer is formed on a substrate. An epitaxial semiconductor layer is formed on the crystalline buffer layer. The epitaxial semiconductor layer is patterned to form a patterned epitaxial semiconductor layer which comprises semiconductor device structures. A surface region of the crystalline buffer layer is oxidized selective to the patterned epitaxial semiconductor layer to convert the surface region of the crystalline buffer layer to an insulating layer. The insulating layer insulates the patterned epitaxial semiconductor layer from the crystalline buffer layer. In one embodiment, the substrate comprises a silicon substrate, the crystalline buffer layer comprises germanium, and the epitaxial semiconductor layer comprises silicon-germanium.

Another embodiment of the invention includes a method for fabricating a semiconductor FinFET device. A crystalline germanium buffer layer is formed on a substrate. An epitaxial silicon-germanium layer is formed on the crystalline germanium buffer layer. The epitaxial silicon-germanium layer is patterned to form a patterned epitaxial semiconductor layer which comprises a plurality of semiconductor fin structures for one or more FinFET devices. A surface region of the crystalline germanium buffer layer is oxidized selective to the patterned epitaxial silicon-germanium layer to convert the surface region of the crystalline germanium buffer layer to a germanium-oxide insulating layer. The germanium-oxide insulating layer insulates the patterned epitaxial silicon-germanium layer from the crystalline germanium buffer layer. One or more gate structures are formed over the semiconductor fin structures. Source and drain structures are then formed on exposed portions of the semiconductor fin structures adjacent the one or more gate structure.

2

Another embodiment of the invention includes a semiconductor device. The semiconductor device includes a crystalline buffer layer disposed on a substrate, an epitaxial semiconductor layer which comprises a pattern of semiconductor device structures, and an amorphous insulating layer disposed between the crystalline buffer layer and epitaxial semiconductor layer. The amorphous insulating layer contacts both the epitaxial semiconductor layer and the crystalline buffer layer.

These and other embodiments will be described in the following detailed description of embodiments, which is to be read in conjunction with the accompanying figures.

BRIEF DESCRIPTION OF THE DRAWINGS

FIGS. 2, 3, 4A, 4B, 5A, 5B, 6A, 6B, 7A, and 7B schematically illustrate a method for fabricating the semiconductor structure of FIG. 1, according to an embodiment of the invention, wherein:

FIG. 2 is a cross-sectional view of the semiconductor structure at an initial stage of fabrication where a buffer layer is formed on a bulk substrate, according to an embodiment of the invention;

FIG. 3 is a cross-sectional view of the semiconductor structure of FIG. 2 after forming a silicon-germanium layer on the buffer layer, according to an embodiment of the invention;

FIGS. 4A and 4B are schematic views of the semiconductor structure of FIG. 3 after patterning the silicon-germanium layer to form a plurality of fin structures for a FinFET device, according to an embodiment of the invention, wherein FIG. 4A is a top plan schematic view of the semiconductor structure, and wherein FIG. 4B is a cross-sectional schematic view of the semiconductor structure taken along line 4B-4B in FIG. 4A;

FIGS. 5A and 5B are schematic views of the semiconductor structure of FIGS. 4A and 4B after performing a selective oxidation process to oxide a portion of the buffer layer to form an insulating layer, according to an embodiment of the invention, wherein FIG. 5A is a top plan schematic view of the semiconductor structure, and wherein FIG. 5B is a cross-sectional schematic view of the semiconductor structure taken along line 5B-5B in FIG. 5A;

FIGS. 6A and 6B are schematic views of the semiconductor structure of FIGS. 5A and 5B after forming a plurality of gate structures over the semiconductor fin structures, according to an embodiment of the invention, wherein FIG. 6A is a top plan schematic view of the semiconductor structure, and wherein FIG. 6B is a cross-sectional schematic view of the semiconductor structure taken along line 6B-6B in FIG. 6A; and FIGS. 7A and 7B are schematic views of the semiconductor structure of FIGS. 6A and 6B after forming source and drain structures, according to an embodiment of the invention, wherein FIG. 7A is a top plan schematic view of the semiconductor structure, and wherein FIG. 7B is a cross-sectional schematic view of the semiconductor structure taken along line 7B-7B in FIG. 7A.

DETAILED DESCRIPTION OF EMBODIMENTS

Embodiments will now be described in further detail with regard to techniques for fabricating SiGe-on-insulator substrates, and for fabricating semiconductor devices, such as FinFET structures, using SiGe-on-insulator substrates. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the term "about" as used herein with regard to thicknesses, percentages, ranges, etc., is meant to denote being close or approximate to, but not exactly. For example, the term "about" as used herein implies that a small margin of error is present, such as 1% or less than the stated amount.

Figure 1:
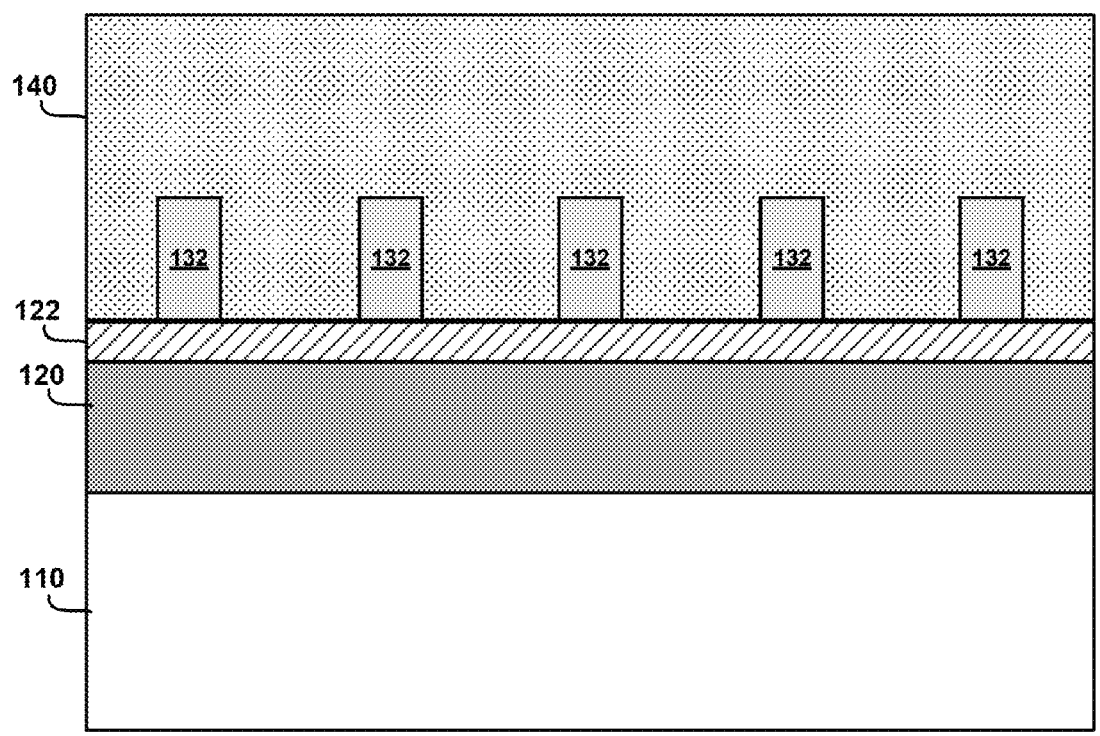
FIG. 1 is a cross-sectional schematic view of a semiconductor structure comprising a silicon-germanium-on-insulator substrate, according to an embodiment of the invention.

FIG. 1 is a cross-sectional schematic view of a semiconductor structure 100 which comprises a SiGe-on-insulator substrate, according to an embodiment of the invention. The semiconductor structure 100 comprises a semiconductor substrate 110, a buffer layer 120, an insulating layer 122, a plurality of semiconductor fin structures 132, and one or more control gate structures 140. In one embodiment, the substrate 110 comprises a bulk silicon substrate, although the substrate 110 can be formed with other materials such as gallium arsenide, or any other suitable substrate material. In one embodiment, the buffer layer 120 is formed of germanium (Ge), and the semiconductor fin structures 132 are formed of silicon-germanium (SiGe).

In one embodiment of the invention, the insulating layer 122 comprises a germanium-oxide layer (GeO) which is formed subsequent to formation of the semiconductor fin structures 132. For example, as explained in further detail below, in one embodiment of the invention, the insulating layer 122 is formed by selectively oxidizing the surface material of the buffer layer 120 selective to the material of the semiconductor fin structures 132. This process allows, for example, a relaxed crystalline semiconductor layer (e.g., SiGe), which is used to form the semiconductor fin structures 130, to be epitaxially grown on top of a crystalline buffer layer 120, followed by formation of the insulating layer 122 (e.g., amorphous layer) by selective oxidation of the buffer layer 120.

Embodiments of the invention as discussed herein are to be contrasted with other methods for fabricating FinFET structures, for example, based on bulk silicon substrates or SOI substrates. In a bulk FinFET process, the semiconductor fins are formed in bulk silicon, and an insulating oxide material (e.g., $SiO_2$) is deposited in the trenches between the semiconductor fins. The insulating oxide material is then etched back to expose some portion of the fins, thus defining a baseline active fin height. With a bulk FinFET process, however, active fin height control is problematic and can vary across a given die or vary from die-to-die due to manufacturing variations and tolerances of the bulk manufacturing process. Such manufacturing variations and tolerances can result in significant variation in FinFET device characteristics within a given die, or across different dies of a given silicon wafer. Moreover, a bulk FinFET process adds cost to the bulk integration for FinFET devices.

On the other hand, with an SOI-based FinFET process, an SOI substrate is utilized having a buried oxide layer disposed between a bulk silicon layer and an active silicon layer (referred to as the SOI layer). The semiconductor fins are formed, in part, by selectively etching the active silicon layer (SOI layer) down to the buried oxide layer using a photolithographic process. In this process, the active fin heights are set by the thickness of the active silicon layer, thus enabling more precise control, and less variation, of the active fin height as compared to the bulk FinFET process. A FinFET process based on an SOI wafer, however, is problematic in that the SOI wafer is more costly than a bulk wafer, and because an epitaxial semiconductor layer (e.g., SiGe) cannot be grown on top of an amorphous insulating layer (e.g., silicon oxide) of an SOI wafer.

Figure 2:
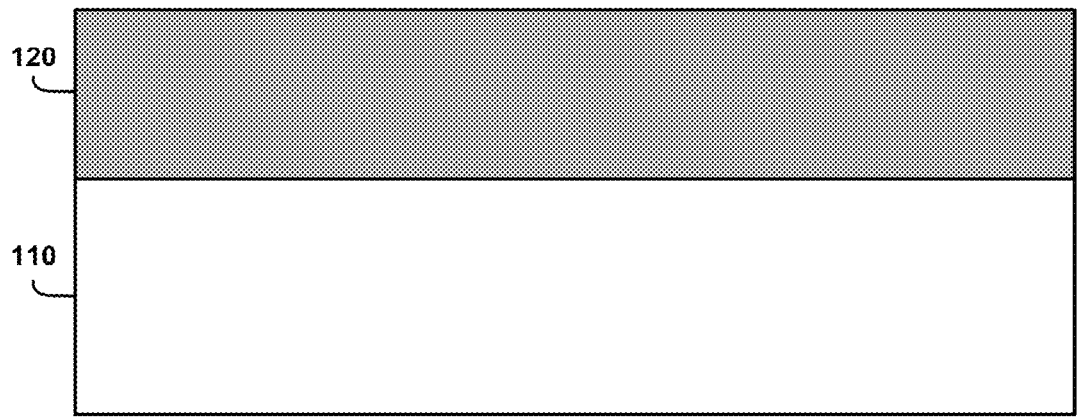

FIGS. 2, 3, 4A, 4B, 5A, 5B, 6A, 6B, 7A, and 7B schematically illustrate a method for fabricating the semiconductor structure of FIG. 1, according to an embodiment of the invention. More specifically, FIGS. 2, 3, 4A, 4B, 5A, 5B, 6A, 6B, 7A, and 7B comprise cross-sectional and top plan schematic views of the semiconductor structure shown in FIG. 1 at various stages of fabrication. Referring initially to FIG. 2, a cross-sectional view of the semiconductor structure 100 is shown at an initial stage of fabrication where the buffer layer 120 is formed on the semiconductor substrate 110, according to an embodiment of the invention. In one embodiment of the invention, as noted above, the semiconductor substrate 110 may comprise a bulk silicon substrate. In other embodiments, the semiconductor substrate 110 may be formed with other types of substrate material, or multiple layers of substrate materials, which are commonly used for semiconductor device fabrication. For example, the semiconductor substrate 110 may include semiconductor materials such comprising germanium, gallium arsenide, III-V compound semiconductor materials, or other types substrate materials that are suitable for a given application.

In one embodiment of the invention, the buffer layer 120 comprises a thin epitaxial buffer layer that is formed of Ge with a thickness in a range of about 100 nm to about 2000 nm. For example, in one embodiment, the buffer layer 120 is formed with a thickness of about 1 μm. The buffer layer 120 can be formed using any suitable epitaxial growth process implemented by means of chemical vapor deposition (CVD) or LPCVD (Low Pressure CVD) or other known epitaxial growth techniques such as, for example, molecular beam epitaxy (MBE) using a Ge source such as $GeH_4$. Prior to formation of the Ge buffer layer 120, semiconductor substrate 110 (e.g., silicon substrate) can be baked in a hydrogen (H2) atmosphere for native oxide desorption.

Figure 3:
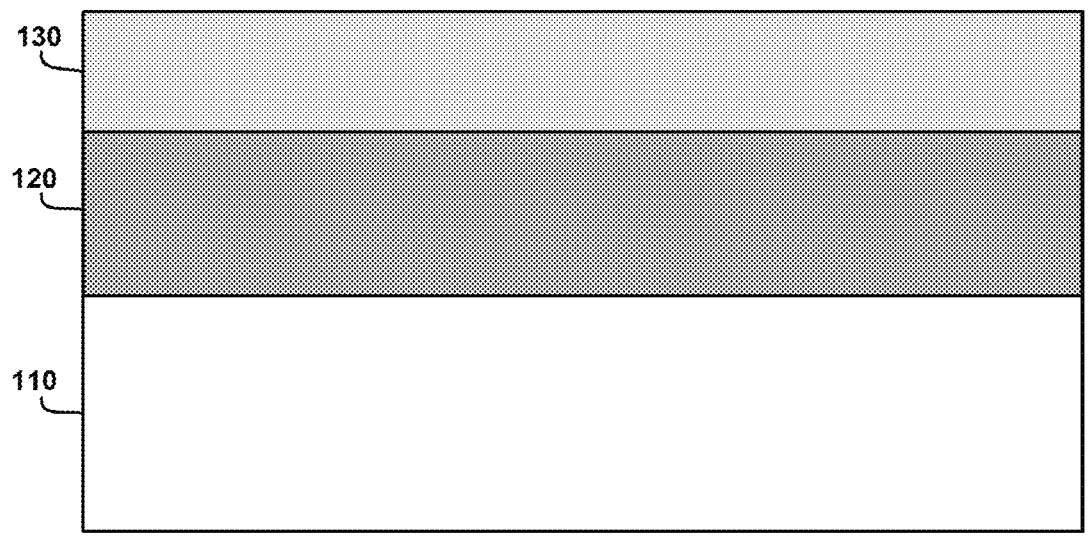

A next step in the process is to deposit a layer of semiconductor material, such as silicon-germanium, on the buffer layer 120, which is to be utilized as an active layer to construct components of active devices, e.g., forming semiconductor fins of FinFET devices. For example, FIG. 3 is a cross-sectional view of the semiconductor structure of FIG. 2 after forming an epitaxial semiconductor layer 130 on the buffer layer 120, according to an embodiment of the invention. In one embodiment of the invention, the epitaxial semiconductor layer 130 is an SiGe layer, which can be formed using any suitable epitaxial growth process implemented by means of CVD or LPCVD or other known epitaxial growth techniques such as, for example, molecular beam epitaxy (MBE). The epitaxial semiconductor layer 130 can be epitaxially grown using SiH4 and GeH4 as sources to form a SiGe layer 130.

In one embodiment, the SiGe layer 130 is primarily a relaxed SiGe layer, which is slightly tensile, with a strain relaxation greater than about 50%. Other relaxation is also possible. In addition, the SiGe layer 130 can be grown with a thickness in a range of about 10 nm to about 100 nm. For example, in one embodiment, the SiGe layer 130 is formed with a thickness of about 30 nm. Further, the SiGe layer 130 can be formed with a Ge concentration in a range of about 1% to about 99%. For example, in one embodiment of the invention, the Ge concentration of the SiGe layer 130 is about 85% with the Si concentration about 15%.

In accordance with embodiments of the invention, the buffer layer 120 serves multiple purposes. For example, the buffer layer 120 provides an epitaxial buffer layer upon which the epitaxial semiconductor layer 130 can be grown to have a desired crystalline structure. Moreover, the buffer layer 130 provides a graded buffer structure that serves to effectively match the lattice constant of the material (e.g., silicon) of the semiconductor substrate 110 to the lattice constant of the material (e.g., SiGe) of the epitaxial semiconductor layer 130. In other words, the buffer layer 120 serves to minimize mechanical strain that would otherwise exist if the semiconductor layer 130 was formed directly on the semiconductor substrate 110 due to the lattice mismatch between the materials of the semiconductor substrate 110 and the semiconductor layer 130. Moreover, as discussed in further detail below, the buffer layer 120 serves as a sacrificial layer that is selectively oxidized to form an insulating layer between the buffer layer 120 and the semiconductor layer 130.

Figure 4A:
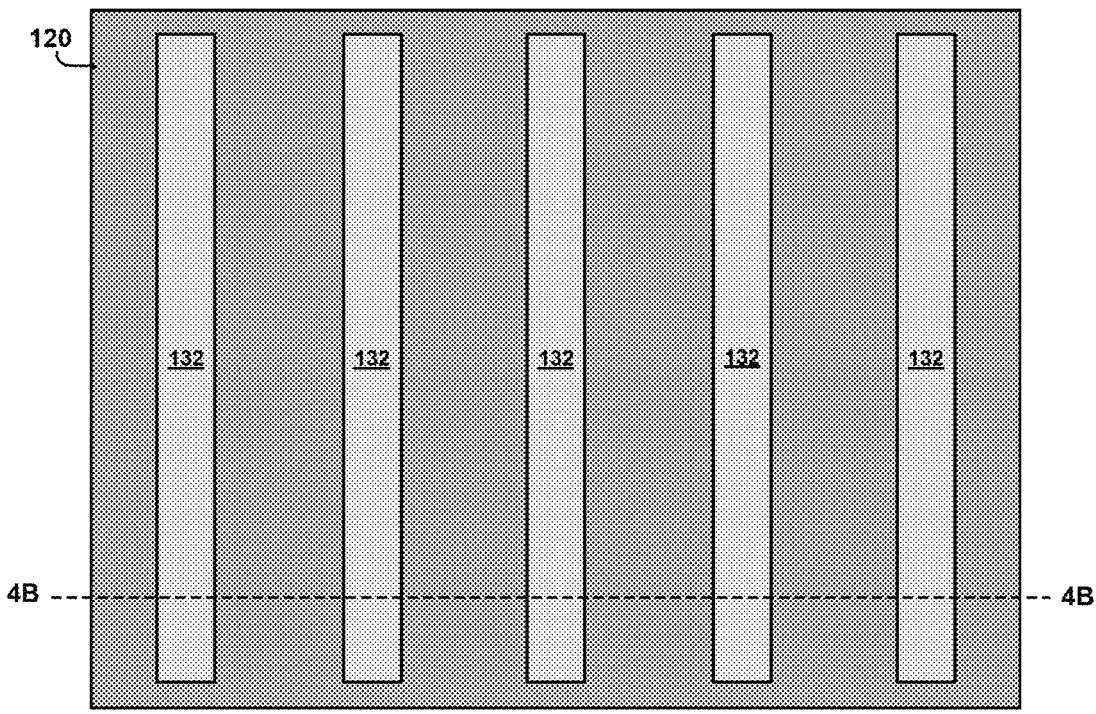
Figure 4B:
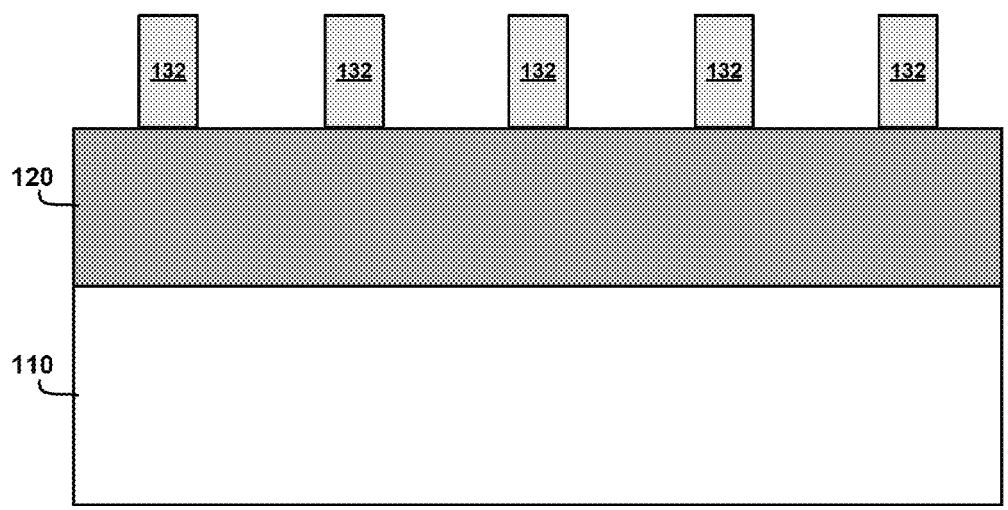

A next step in the exemplary fabrication process comprises patterning the epitaxial semiconductor layer 130 to form device structures. For example, FIGS. 4A and 4B schematically illustrate the semiconductor structure of FIG. 3 after patterning the epitaxial semiconductor layer 130 to form the plurality of semiconductor fin structures 132 for a FinFET device, according to an embodiment of the invention. FIG. 4A is a top plan schematic view of the semiconductor structure showing the semiconductor fin structures 132 formed on top of the buffer layer 120, and FIG. 4B is a cross-sectional schematic view of the semiconductor structure taken along line 4B-4B in FIG. 4A. The semiconductor fin structures 132 can be formed by patterning the epitaxial semiconductor layer 130 using a standard photolithographic and dry etch process.

For example, a layer of photoresist material can be deposited on top of the epitaxial semiconductor layer 130, and lithographically patterned (exposed and developed) to form a photoresist mask having a target pattern (which defines the semiconductor fin structures 132) to be transferred to the epitaxial semiconductor layer 130. An etch process is performed using the photoresist mask to etch a portion of the epitaxial semiconductor layer 130 down to the buffer layer 120 using a dry etching process such as RIE (reactive ion etching) or using any other anisotropic etch processes and etch environments with etching chemistries that are suitable to etch the epitaxial semiconductor layer 130. The height and width of the semiconductor fin structures 132, and the pitch between the semiconductor fin structures 132, will vary depending on the application.

Figure 5A:
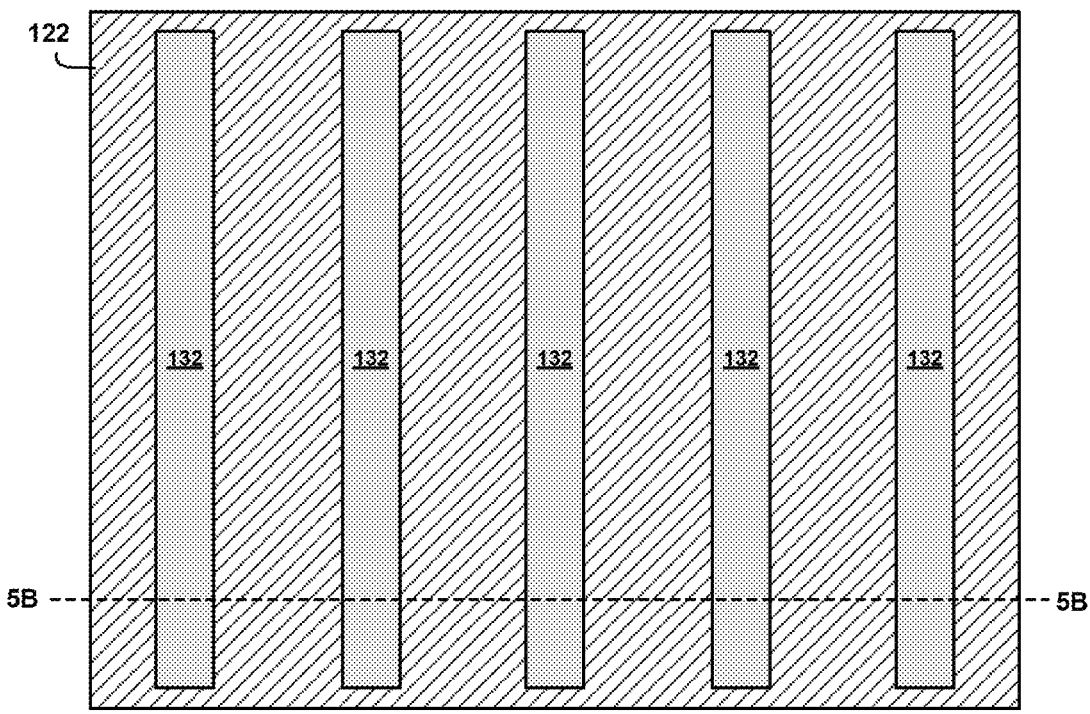
Figure 5B:
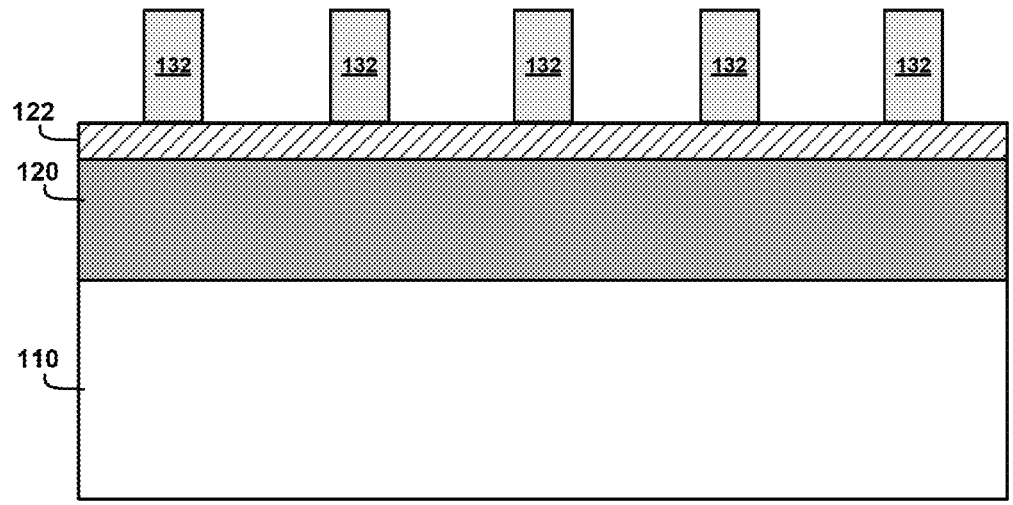

After the semiconductor fin structures 132 are formed, an insulating layer is formed by oxidizing a surface of the buffer layer 120. For example, FIGS. 5A and 5B schematically illustrate the semiconductor structure of FIGS. 4A and 4B after performing a selective oxidation process to oxidize a surface of the buffer layer 120 and form the insulating layer 122, according to an embodiment of the invention. FIG. 5A is a top plan schematic view of the semiconductor structure, and FIG. 5B is a cross-sectional schematic view of the semiconductor structure taken along line 5B-5B in FIG. 5A, which show the insulating layer 122 formed in upper surface region of the buffer layer 120.

In one embodiment of the invention, the insulating layer 122 comprises a germanium oxide (GeO) layer which is formed by oxidizing the surface of the germanium buffer layer 120, which is exposed through the patterned semiconductor fin structures 132. In one embodiment, the oxidation process is performed using a low-temperature plasma-assisted oxidation process, with an oxygen plasma stream generated using known techniques and other precursors (inert gases) such as nitrogen or argon. The oxidation process is performed selectively so that the material of the buffer layer 120 is oxidized and the semiconductor material (e.g., SiGe) of the semiconductor fin structures 132 is not oxidized. In one embodiment of the invention, the insulating layer 122 is formed with a thickness in a range of about 0.1 µm to about 0.5 µm.

In accordance with embodiments of the invention, the selective oxidation process enables the formation of a SiGe-on-insulator substrate wherein the insulating layer 122 is formed after the epitaxial semiconductor layer 130 (e.g., SiGe layer) is formed on the buffer layer 120. This process allows the formation of, e.g., an epitaxial SiGe semiconductor layer for use with active devices, which could not otherwise be grown on top of the amorphous GeO insulating layer 122, or on top of an amorphous insulating layer in conventional SOI wafers. Moreover, the ability to form a SiGe-on-insulator substrate according using techniques as discussed herein, in which an epitaxial SiGe layer 130 is used to form the semiconductor fin structures 132 for FinFET devices, eliminates subsequent process steps of conventional methods in which thin SiGe layers are grown on Si fin structures to construct FinFET devices using bulk Si wafer technologies.

Figure 6A:
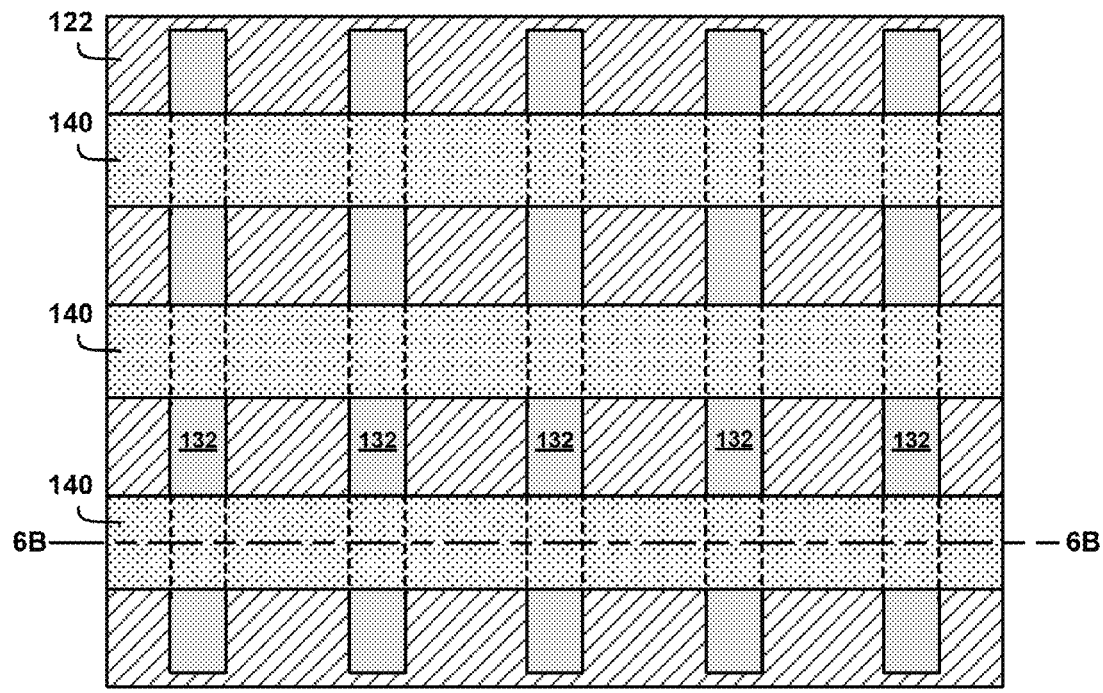
Figure 6B:
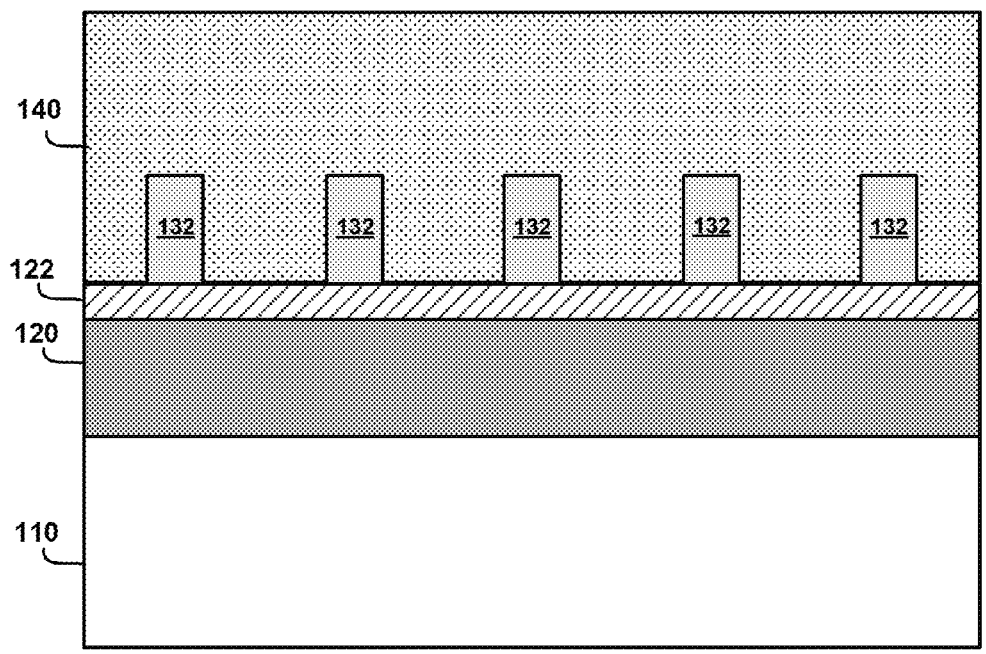

A next step in the exemplary process is to form one or more gate structures for the FinFET devices. FIGS. 6A and 6B schematically illustrate the semiconductor structure of FIGS. 5A and 5B after forming a plurality of gate structures 140 over the semiconductor fin structures 132, according to an embodiment of the invention. FIG. 6A is a top plan schematic view of the semiconductor structure showing the gate structures 140 formed in a direction that is orthogonal to the semiconductor fin structures 132, wherein FIG. 6B is a cross-sectional schematic view of the semiconductor structure taken along line 6B-6B in FIG. 6A showing one of the gate structures 140. The gate structures 140 can be formed using various techniques known in the art.

For example, the gate structures 140 of the FinFETs can be formed using a "gate-first" process wherein a gate stack and spacers are formed prior to a selective epitaxial growth process, for example, wherein source and drain regions are enlarged. In a "gate-first" process, the gate structures 140 shown in FIGS. 6A/6B may be formed by depositing a conformal gate dielectric layer over the semiconductor fin structures 132, depositing a metallic gate layer over the gate dielectric layer, depositing a dielectric/insulating layer over the metallic gate layer, and then performing an etch process to pattern the gate structures 140.

In another embodiment, the gate structures 140 of the FinFETs can be formed using a "gate-last" process which involves, for example, forming dummy gate structures (e.g., polysilicon gates), fabricating other elements of the FinFET devices, removing the dummy gate structures, and replacing the removed dummy gate with actual gate materials. With this process, for example, the gate structures 140 would be dummy gate structures formed of polysilicon, for example. The dummy gate structures are sacrificial structures that are subsequently removed and replaced by a replacement metal gate (RMG) potentially including a gate dielectric layer, a work function metal layer, and a metal electrode. Because the RMG structures are formed after the other components of the FinFET devices are formed, the RMG structures are not subjected to various potentially damaging processing steps, for example high-temperature anneals.

Figure 7A:
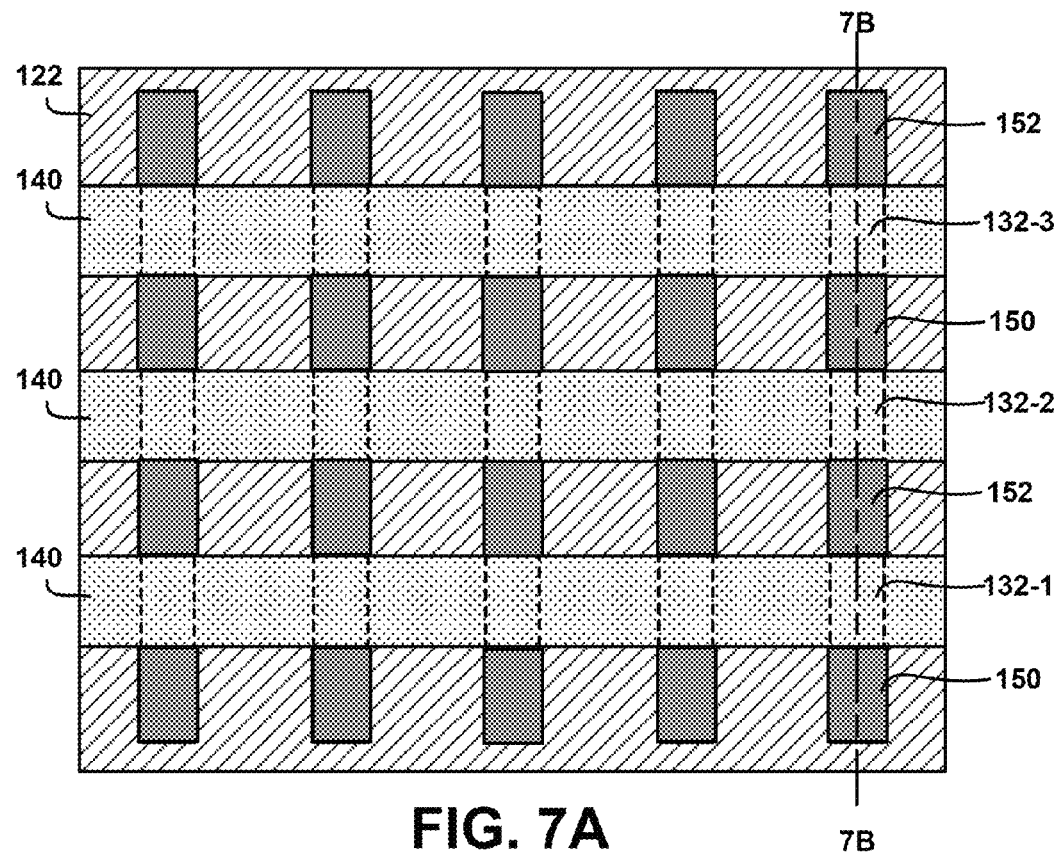
Figure 7B:
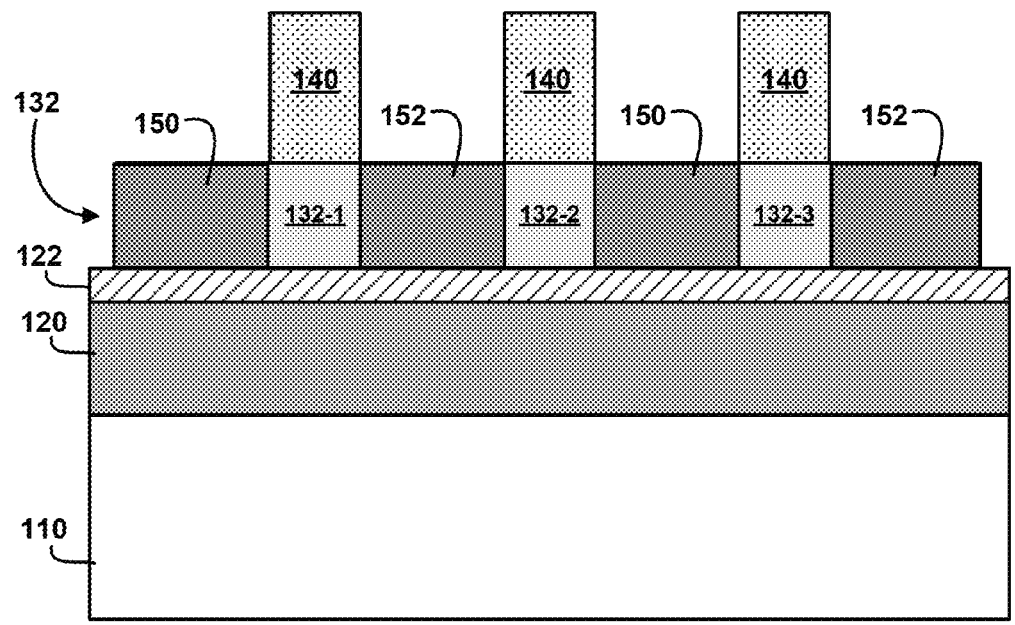

A next step in the exemplary process is to form source and drain structures on the exposed portions of the fin structures 132 that are not covered by the gate structures 140. For example, FIGS. 7A and 7B schematically illustrate the semiconductor structure of FIGS. 6A and 6B after forming source structures 150 and drain structures 152, according to an embodiment of the invention. FIG. 7A is a top plan schematic view of the semiconductor structure showing source structures 150 and drain structures 152 formed on exposed portions of the semiconductor fin structures 132 between the gate structures 140 or, more specifically, on opposing sides of device channel regions 132-1, 132-2, and 132-3. FIG. 7B is a cross-sectional schematic view of the semiconductor structure taken along line 7B-7B in FIG. 7A showing alternating source/drain structures 150/152 formed at regions along one of the semiconductor fin structures 132 on opposite sides of the device channel regions 132-1, 132-2, and 132-3.

The source structures 150 and drain structures 152 can be formed using various techniques. For example, in one embodiment, the source structures 150 and drain structures 152 can be formed by doping the exposed portions of the semiconductor fin structures 132 using ion implantation techniques. In particular, for NFET devices, the source and drain structures 150 and 152 can be formed by doping the exposed portions of the semiconductor fin structures 132 with Group III elements (for PFET devices) or Group V elements (for NFET devices). Typical dopants include Boron, Arsenic, Phosphorus, Gallium, Antimony, etc. For example, boron is a p-type dopant, whereas Phosphorus is an n-type dopant.

In another embodiment of the invention, the source and drain structures 150 and 152 can be doped using a solid phase diffusion method. With this process, a highly doped layer of semiconductor material is deposited over the exposed semiconductor fin structures 132, which is followed by a thermal anneal process to cause dopants to diffuse from the doped layer into the portions of the semiconductor fin structures covered by the doped layer.

In yet another embodiment, the source and drain structures 150 and 152 can be formed by epitaxy, wherein a doped SiGe layer, for example, can be epitaxially grown on the exposed portions of the semiconductor fin structures 132 using known techniques. An epitaxial layer can be doped during deposition by adding impurities to the source gas, such as arsine, phosphine or diborane, for example, wherein the concentration of impurity in the gas phase determines its concentration in the deposited film. With this epitaxy process, a merging can occur, wherein epitaxial growth of the SiGe layer on the exposed surfaces of the semiconductor fin structures 132 can result in contact of adjacent drain structures 150 and contact of adjacent source structures 152.

Figure 8:
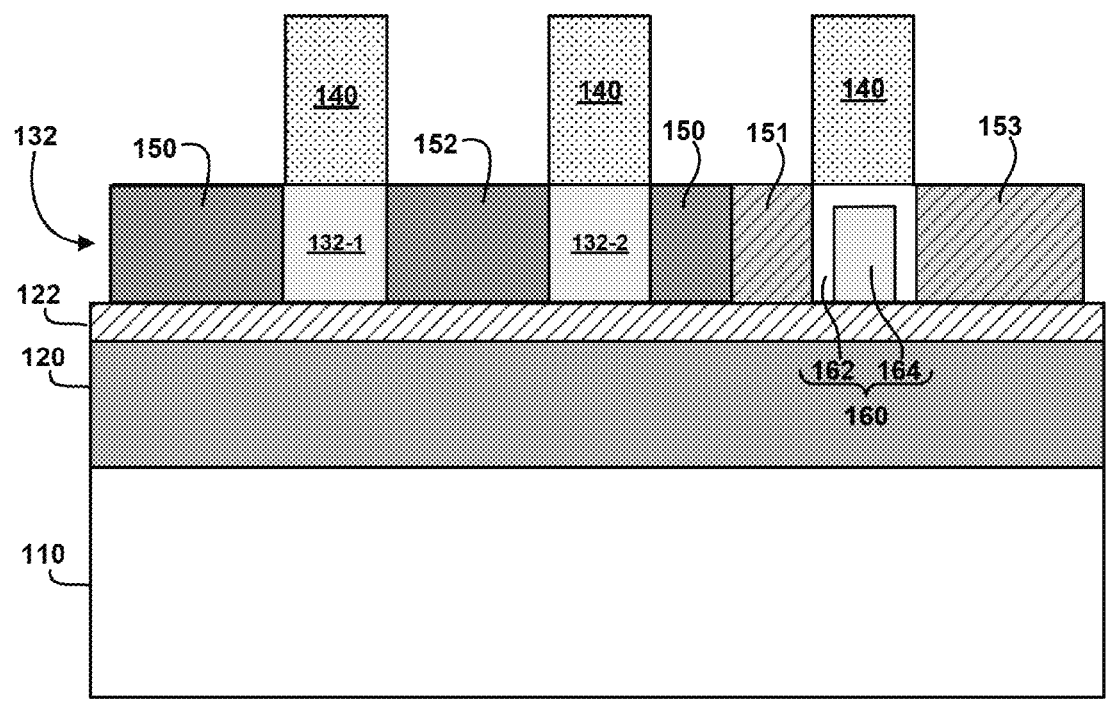
FIG. 8 is a cross-sectional schematic view of a semiconductor structure comprising a silicon-germanium-on-insulator substrate, according to another embodiment of the invention.

While FIGS. 7A and 7B illustrate the formation of source and drain contacts 150 and 152 for n-type FinFET devices, in other embodiments of the invention, the both n-type and p-type FinFET devices can be formed for, e.g., CMOS applications. For example, FIG. 8 is a cross-sectional schematic view of a semiconductor structure comprising a SiGe-on-insulator substrate, according to another embodiment of the invention, which comprises n-type and p-type FinFET devices. In particular, FIG. 8 is similar to the structure shown in FIG. 7B, except the semiconductor structure shown in FIG. 8 further comprises a source structure 151 and drain structure 153 for an p-type FinFET. In addition, a channel region 160 of the p-type FinFET is modified for p-type operation.

In particular, as shown in FIG. 8, a p-channel region 160 of the p-type FinFET comprises a pure Ge layer (or Ge channel), which surrounds an inner SiGe portion 164 of the channel region 160. The pure Ge layer 162 can be formed using a condensation process to recover a pure Ge channel layer from the original SiGe material. In another embodiment, the Ge layer 162 can be epitaxially grown on the portion of the SiGe material of the semiconductor fin structure 132 which defines the channel region 160 for the p-type FinFET device. The channel region 160 can be fabricated prior to formation of the gate structures 140. Furthermore, in another embodiment of the invention, the source and drain structures 151 and 153 for p-type FinFET devices can be formed of strained germanium-tin (GeSn), which is designed to apply a uniaxial compressive stress that enhances operation of p-type FinFET devices.

Following the formation of the source and drain structures in the embodiments of FIG. 7B or FIG. 8, any standard sequence of processing steps can be implemented to complete the fabrication of the n-type and/or p-type FinFET devices and other elements of the integrated circuit to be fabricated, the details of which are not needed to understand embodiments of the invention as discussed herein.

It is to be understood that the methods discussed herein for fabricating SiGe-on-insulator structures can be incorporated within semiconductor processing flows for fabricating other types of semiconductor devices and integrated circuits with various analog and digital circuitry or mixed-signal circuitry. SiGe is a commonly used semiconductor material in integrated circuits for heterojunction bipolar transistors or as a strain-inducing layer for CMOS transistors. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for fabricating a semiconductor device, comprising:
   forming a crystalline germanium buffer layer on a substrate;
   forming an epitaxial silicon-germanium layer on the crystalline germanium buffer layer;
   etching the epitaxial silicon-germanium layer to form openings through the epitaxial silicon-germanium layer down to the crystalline germanium buffer layer, wherein the openings define a patterned epitaxial silicon-germanium layer which comprises a plurality of semiconductor fin structures for one or more FinFET devices; and
   oxidizing a surface region of the crystalline germanium buffer layer through said openings of the epitaxial silicon-germanium layer to convert the surface region of the crystalline germanium buffer layer to a germanium-oxide insulating layer;
   wherein the oxidizing of the surface region of the crystalline germanium buffer layer does not oxidize any portion of the patterned epitaxial silicon-germanium layer; and
   wherein the germanium-oxide insulating layer insulates the patterned epitaxial silicon-germanium layer from the crystalline germanium buffer layer.

2. The method of claim 1, wherein the crystalline germanium buffer layer is formed on a silicon substrate.

3. The method of claim 1, wherein oxidizing the surface region of the crystalline germanium buffer layer is performed using a low-temperature plasma-assisted oxidation process.

4. The method of claim 1, wherein the germanium-oxide insulating layer comprises amorphous germanium oxide.

5. The method of claim 1, wherein the germanium-oxide insulating layer is formed with a thickness in a range of about 0.1 µm to about 0.5 µm.

6. The method of claim 1, wherein the epitaxial silicon-germanium layer comprises a germanium concentration of at least 85%.

7. A method for fabricating a semiconductor device, comprising:
   forming a crystalline germanium buffer layer on a substrate;
   forming an epitaxial silicon-germanium layer on the crystalline germanium buffer layer;
   etching the epitaxial silicon-germanium layer to form openings through the epitaxial silicon-germanium layer down to the crystalline germanium buffer layer, wherein the openings define a patterned epitaxial silicon-germanium layer which comprises a plurality of semiconductor fin structures for one or more FinFET devices;
   oxidizing a surface region of the crystalline germanium buffer layer through said openings of the epitaxial silicon-germanium layer to convert the surface region of the crystalline germanium buffer layer to a germanium-oxide insulating layer;
   wherein the oxidizing of the surface region of the crystalline germanium buffer layer does not oxidize any portion of the patterned epitaxial silicon-germanium layer;
   wherein the germanium-oxide insulating layer insulates the patterned epitaxial silicon-germanium layer from the crystalline germanium buffer layer;
   forming one or more gate structures over the semiconductor fin structures; and
   forming source and drain structures on exposed portions of the semiconductor fin structures adjacent the one or more gate structure.

8. The method of claim 7, wherein the crystalline germanium buffer layer is formed on a silicon substrate.

9. The method of claim 7, wherein oxidizing the surface region of the crystalline germanium buffer layer is performed using a low-temperature plasma-assisted oxidation process.

10. The method of claim 7, wherein the germanium-oxide insulating layer comprises amorphous germanium-oxide.

11. The method of claim 7, wherein the germanium-oxide insulating layer is formed with a thickness in a range of about 0.1 µm to about 0.5 µm.

12. The method of claim 7, wherein the epitaxial silicon-germanium layer comprises a germanium concentration of at least 85%.

* * * * *